(12) United States Patent
Sanders et al.

(10) Patent No.: US 10,566,988 B2
(45) Date of Patent: Feb. 18, 2020

(54) CONTROLLER FOR SWITCHING CONVERTER

(71) Applicant: Infineon Technologies Austria AG, Villach (DE)

(72) Inventors: Anthony Sanders, Weißenfeld (DE); Matthias Schneider, Kirchheim (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/377,430

(22) Filed: Apr. 8, 2019

(65) Prior Publication Data

US 2019/0312583 A1 Oct. 10, 2019

(30) Foreign Application Priority Data

Apr. 9, 2018 (DE) .................. 10 2018 108 298

(51) Int. Cl.
*H03M 1/18* (2006.01)
*G06F 15/78* (2006.01)

(52) U.S. Cl.
CPC .......... *H03M 1/18* (2013.01); *G06F 15/7814* (2013.01)

(58) Field of Classification Search
CPC .............................. H03M 1/18; G06F 15/7814
USPC ......................................... 341/118, 141, 158
See application file for complete search history.

(56) References Cited

U.S. PATENT DOCUMENTS

| 6,184,659 | B1 * | 2/2001 | Darmawaskita ...... H02J 7/0052 320/137 |
| 8,276,007 | B2 * | 9/2012 | Hara ................. H02M 3/33515 323/235 |
| 2004/0093530 | A1 | 5/2004 | Watts |
| 2010/0241879 | A1 | 9/2010 | Hara et al. |

OTHER PUBLICATIONS

Office Action, German Application No. 10 2018 108 298.3, dated Nov. 29, 2018, pp. 6.

* cited by examiner

*Primary Examiner* — Khai M Nguyen
(74) *Attorney, Agent, or Firm* — Armis IP Law, LLC

(57) ABSTRACT

A control circuit for a switching converter is described herein. In accordance with one embodiment the control circuit includes an analog bus that receives a plurality of input signals and a first set of functional units that are operable to receive at least some of the input signals via the analog bus and to process the input signals to generate digital output data based on the input signals. The control circuit further includes an event bus that has an event bus controller and a plurality of bus lines and a second set of functional units that are operable to receive the output data, via the event bus, from the functional units of the first set. At least one functional unit of the second set of functional units is operable to determine switching time instants for the switching converter based on the output data received via the event bus, and the event bus controller includes an arbiter operable to arbitrate data transmission across the bus lines.

16 Claims, 3 Drawing Sheets

CONTROLLER FOR SWITCHING CONVERTER

TECHNICAL FIELD

The present disclosure relates to controllers for the use in switching converters that may be employed in switched mode power supplies or the like.

RELATED APPLICATION

This application is related to and claims priority to earlier filed German patent application serial number 10 2018 108298.3 entitled "CONTROLLER FOR SWITCHING CONVERTER," (German attorney docket no. IFV556DE), filed on Apr. 9, 2018, the entire teachings of which are incorporated herein by this reference.

BACKGROUND

In modern power conversion applications such as switched-mode power supplies (SMPS) dedicated control circuits (controllers) are used to control switching converters in order to efficiently convert an input voltage into an output voltage. Controllers used in connection with switching converters may include, inter alia, a processor, peripherals, as well as further components for controlling the switching operation of the switching converter and for regulating the output voltage to obtain a desired system behavior.

Dependent on the application, a controller for a switching converter is often implemented as an Application Specific Integrated Circuit (ASIC) including a microcontroller (i.e. a microprocessor and some peripherals) together with other circuits such as interface circuits (used to connect with e.g. sensor circuits), driver circuits, communication interfaces, etc. Modern switching converter controllers are designed to flexibly support various switching converter topologies (e.g. buck converters, boost converters, flyback converters, Ćuk converters, LLC converters, etc.) and various operation modes such as Continuous conduction mode (CCM) with pulse width modulation (PWM), CCM with pulse frequency modulation (PFM), discontinuous conduction mode (DCM) with PWM or PWM, quasiresonant mode (QR mode), burst mode, low power consumption mode (sleep mode), etc. In order to provide the required functionality, the switching converter controller may include, besides he mentioned microprocessor, various analog and digital circuits (function blocks) that need to flexibly communicate with each other. In this context it should be noted that the communication/signaling between the mentioned function blocks may be subject to harsh real-time constraints.

SUMMARY

A control circuit for a switching converter is described herein. In accordance with one embodiment, the control circuit includes an analog bus that receives a plurality of input signals and a first set of functional units that are operable to receive at least some of the input signals via the analog bus and to process the input signals to generate digital output data based on the input signals. The control circuit further includes an event bus that has an event bus controller and a plurality of bus lines and a second set of functional units that are operable to receive the output data, via the event bus, from the functional units of the first set. At least one functional unit of the second set of functional units is operable to determine switching time instants for the switching converter based on the output data received via the event bus, and the event bus controller includes an arbiter operable to arbitrate data transmission across the bus lines.

In accordance with further embodiments, the switching converter includes a high-side switch and a low-side switch operable to produce an output voltage; the switching time instants are used to control timing of controlling activation of the high-side switch and the low-side switch.

In yet further embodiments, the event bus controller is operable to receive a first request signal from a first functional unit, the first functional unit being in the first set; the event bus controller is operable to receive a second request signal from a second first functional unit, the second functional unit being in the second set. The first request signal and the second request signal are assigned different priorities, the first request signal assigned a higher priority than the second request signal.

In still further embodiments, the event bus controller is operable to receive first data from the first functional unit prior to receiving second data from the second functional unit in accordance with the different assigned priorities. The event bus controller is operable to send a first acknowledgment signal to the first functional unit indicating receipt of the first data; and the event bus controller is operable to send a second acknowledgment signal to the second functional unit indicating receipt of the second data.

Furthermore, embodiments herein include a method for controlling a switching converter is described herein. In accordance with one embodiment, the method includes: receiving a plurality of input signals by an analog bus; receiving at least some of the input signals, via the analog bus, by a first functional unit of a first set of functional units; processing the received input signals by the first functional unit to generate digital output data based on the received input signals; transmitting the output data to an event bus which comprises an event bus controller and a plurality of bus lines; arbitrating data transmission across the bus lines by an arbiter included in the event bus controller; and receiving the output data by a second functional unit of a second set of functional units via the event bus; and determining, by the second functional unit, switching time instants for the switching converter based on the output data received via the event bus.

BRIEF DESCRIPTION OF THE DRAWINGS

The invention can be better understood with reference to the following drawings and descriptions. The components in the figures are not necessarily to scale; instead emphasis is placed upon illustrating the principles of the invention. Moreover, in the figures, like reference numerals designate corresponding parts. In the drawings.

DETAILED DESCRIPTION

Figure 1:
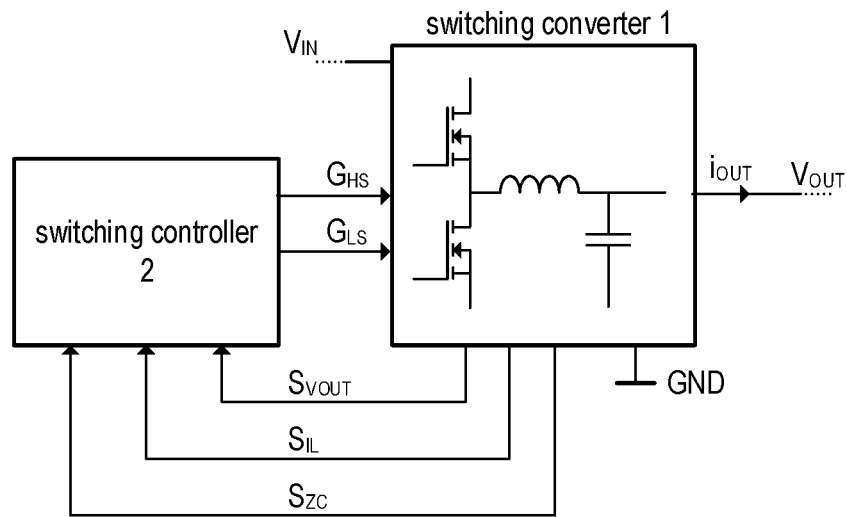
FIG. 1 is a general example of a switched mode power supply (SMPS) circuit including a switching converter and a controller according to embodiments herein.

FIG. 1 illustrates a block diagram of a switched mode power supply with a switching converter 1 and an integrated controller circuit 2 (switching converter controller), which includes an embedded microprocessor and further circuitry used to operate the switching controller. The switching converter may be implemented in accordance with any common switching converter topology such as a buck converter topology, boost converter topology, flyback converter topology, Ćuk converter topology, or the like. In any of these examples, the switching converter includes at least one inductor and at least one controllable semiconductor switch, such as a MOS transistor, a bipolar transistor or any other type of transistor, and is operable to convert an input voltage $V_{IN}$ into an output voltage VOuT (with reference to ground potential GND). In some applications, the output voltage may be buffered with an output capacitor.

The switching converter 1 may include sensing circuits operable to provide sensor signals $S_{VOUT}$, $S_{IL}$, $S_{SC}$, representing the output voltage, the inductor voltage, the secondary side voltage (in case the switching converter includes a transformer), etc. These sensor signals (feedback signals) are fed back to the switching converter controller 2, which is operable to generate, based on at least some of the feed-back signals (dependent on the operating mode), one or more drive signals $G_{HS}$, $G_{LS}$ for driving the semiconductor switch(es) included in the switching converter 1.

Switching converters may be operated in various operating modes such as, for example, continuous conduction mode (CCM) with pulse-width modulation (PWM), discontinuous conduction mode (DCM) with PWM, DCM with pulse frequency modulation (PFM), etc. The mentioned switching converter topologies as well as control structures and algorithms for controlling a switching converter in a particular mode, as well as during a mode switch, are as such known and not further explained herein in detail.

Figure 2:
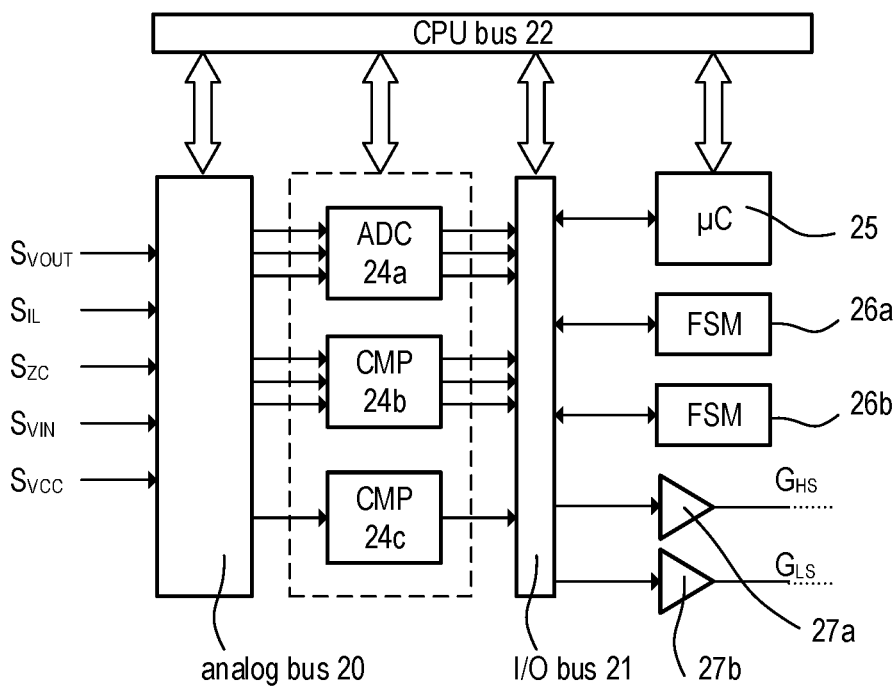
FIG. 2 illustrates one exemplary block diagram of a switching converter controller according to embodiments herein.

FIG. 2 is a block diagram illustrating one exemplary implementation of a switching converter controller 2. Accordingly, the switching converter controller 2 includes a microcontroller 25 with a microprocessor (central processing unit, CPU) and basic peripheral components such as random access memory, non-volatile memory, interrupt controller or the like, as well as a CPU bus 22 and an Input/Output (I/O) bus 21. The microcontroller 25 may be, for example, an ARM Cortex-M microcontroller. However, various other microcontrollers may be used as an alternative. In applications with an ARM microcontroller, the CPU bus 22 may be a so-called Advanced High-performance Bus (AHB) and the I/O bus 21 may be an Advanced Peripheral Bus (APB). Both, AHB and APB are part of the ARM Advanced Microcontroller Bus Architecture (AMBA), which is an open standard for on-chip interconnects between different functional units of system-on-a-chip (SoC) designs. Again, other types of busses may be used instead.

The switching converter controller 2, further includes an analog bus 20, which is operable to direct the incoming input signals, such as the mentioned sensor signals $S_{VOUT}$, $S_{IL}$, $S_{ZC}$, etc., to defined functional units such as analog-to-digital converters, analog comparators or the like. In the present example, analog-to-digital-converter 24a, and analog comparators 24b, 24c may receive one of the input signals via the analog bus 20. These functional units may communicate with the microcontroller 25 and other functional units, such as the finite state machines 26a and 26b, and the gate drivers 27a, 27b via the I/O bus 21. In this regard it is noted that the communication across the I/O bus 21 needs to be managed by the microcontroller 25. That is, for example, when a comparator output of comparator 24c is to be communicated to the finite state machine 26b, the microcontroller is involved in that communication.

The control algorithms which determine the switching time instants (i.e. a transition in the drive signals $G_{HS}$ and $G_{LS}$ used to drive the electronic switches of the switching converter are executed by the microprocessor of the microcontroller 25 and the finite state machines 26a, 26b. Microcontroller 25 and finite state machines 26a, 26b process the input signals received via the analog bus 20 and generate, based on the received signals, output signals that cause the gate drivers 27a, 27b to generate the drive signals $G_{HS}$ and $G_{LS}$. Thereby, the operation of the analog bus 20, the I/O bus 21 and some functional units (e.g. analog-to-digital-converter 24a and comparators 24b, 24c) are controlled by the microcontroller 25 via the CPU bus 22. Thus, the microcontroller 25 needs to control the signal flow from the analog bus 20 to the I/O bus 21 and further to the finite state machines 26a, 26b, and the microcontroller 25. As a consequence, the software executed by the microcontroller 25 needs to include software routines for controlling the mentioned signal flow, which entails additional complexity of the software and difficulties in fulfilling strict real-time requirements.

Figure 3:
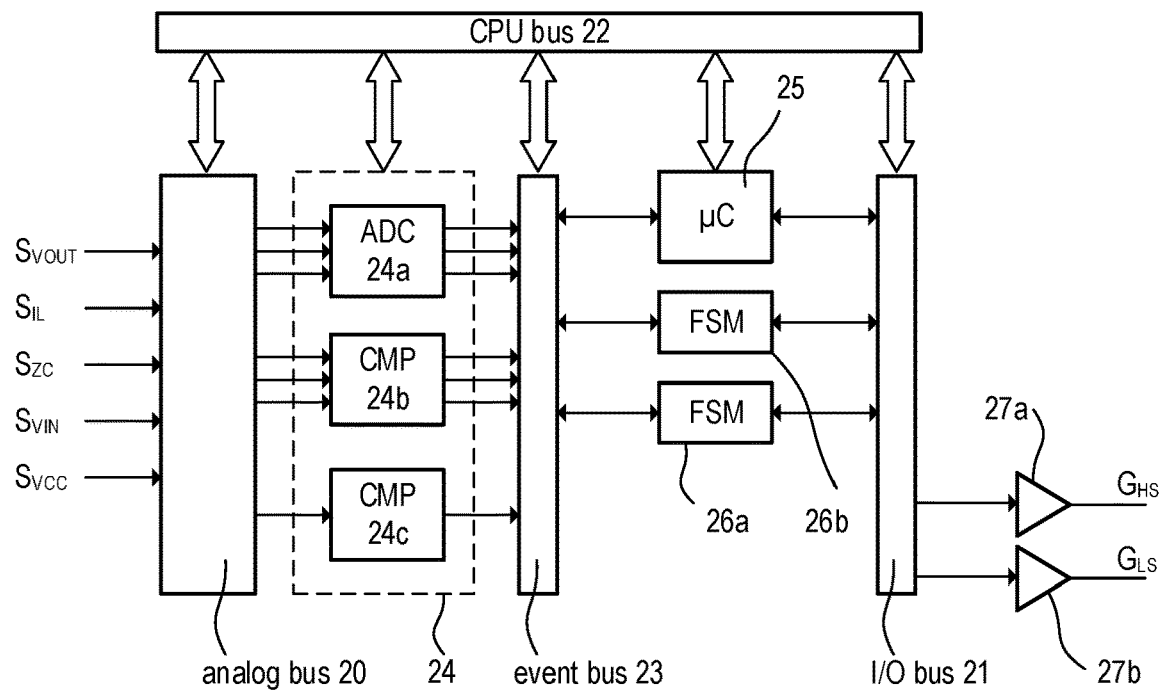
FIG. 3 illustrates a block diagram of one embodiment of an improved switching converter controller according to embodiments herein.

FIG. 3 illustrates one embodiment of an improved switching converter controller, in which a so-called event bus 23 is used to simplify the signal flow between different functional units (e.g. analog-to-digital converter 24a, FSM 26a, micro controller 15). In the example of FIG. 3, the micro controller 25, the CPU bus 22, the IO bus 21, the analog bus 20 as well as the functional units 24 (e.g. analog-to-digital converter 24a, comparators 24c, 24c) are substantially the same as in the previous example of FIG. 2. Accordingly, the switching converter controller 2 includes a microcontroller 25 with a microprocessor (central processing unit, CPU) and basic peripheral components such as random access memory, non-volatile memory, interrupt controller or the like, as well as a CPU bus 22 and an Input/Output (I/O) bus 21. The microcontroller 25 may be, for example, an ARM Cortex-M micro controller. However, various other microcontrollers may be used as an alternative. In applications with an ARM microcontroller, the CPU bus 22 may be a so-called AHB and the I/O bus 21 may be an APB. It is understood that other types of busses may be used instead. The analog bus 20 is operable to direct the incoming input signals, such as the mentioned sensor signals $S_{VOUT}$, $S_{IL}$, $S_{ZC}$, etc., to defined functional units 24 (e.g. analog-to-digital-converter 24a, and analog comparators 24b, 24c).

Different from the previous example of FIG. 2, a dedicated event bus 23 handles the communication between the functional units 24 and other functional units such as the state machines 26a, 26b and the micro controller 25 without involving the micro controller 25 in the bus communication process. In other words, the event bus 23 allows a direct communication between, for example, the analog-to digital converter 24a, the comparators 24b, 24c and the finite state machines 26a, 26b (without requiring the micro controller 25 to manage the communication). The functional units 24 as well as the state machines 26a, 26b can operate autonomously, i.e. without supervision or interaction of the micro controller 25, wherein the event bus 23 allows arbitrary point-to-point and point-to-multiple-points connections, which can be configured by the functional units connected to the event bus 23 without involvement of the micro controller 25.

The control algorithms which determine the switching time instants (i.e. a transition in the drive signals $G_{HS}$ and $G_{LS}$ used to drive the electronic switches of the switching converter are executed by the microprocessor of the microcontroller 25 and the finite state machines 26a, 26b. Microcontroller 25 and finite state machines 26a, 26b process the input signals received via the analog bus 20 and generate, based on the received signals, output signals that cause the gate drivers 27a, 27b to generate the drive signals $G_{HS}$ and $G_{LS}$. Thereby, the operation of the analog bus 20, the I/O bus 21 and some functional units (e.g. analog-to-digital-converter 24a and comparators 24b, 24c) are controlled by the microcontroller 25 via the CPU bus 22. Thus, the microcontroller 25 needs to configure the analog bus 20 to direct the analog signals to the functional units 24, which generate digital data based on the received analog signals. The digital output of the functional units 24 are communicated, for example, to the state machines 26a, 26b (and also to the micro controller 25) via the event bus 23, which operates independently from the micro controller 25.

In the example of FIG. 3, the communication between the gate drivers 27a, 27b is handled by the I/O bus 21. However, in other embodiments, the gate drivers 27a, 27b may be directly driven by one or more state machines, e.g. state machines 26a and 26b. Although only two state machines 26a, 26b are shown in the example of FIG. 3, more than two hardware-implemented finite state machines may be provided dependent on the actual application. As mentioned, the finite state machines process specific subroutines of the control algorithms, which may be particularly real-time critical. For example, one finite state machine may be provided for determining the switch-on time instant of the inductor current in QR mode, for which a precise detection of a voltage minimum (so-called valley switching) is implemented. Another finite state machine may be provided for determining the switch-off time instant of the inductor current during CCM or DCM operation with pulse width modulation or during resonant operation (e.g. with LLC converter topologies). The micro controller 25 can perform various tasks such as setting regulation parameters and performing calculations that are not real-time critical.

In the present example of FIG. 3, two different sets of functional units are illustrated. Functional units of the first set basically serve as data sources such as the functional units 24 (e.g. analog-to-digital converters comparators, etc.), whereas functional units of the second set basically serve as data sinks for the output data provided by the data sources. Examples for the functional units of the second set are the finite state machines 26a, 26b as well as the microcontroller 25 (e.g. the interrupt handler of the microcontroller 25). This distinction between functional units that serve as data sources and functional units that serve as data sinks does not mean that a data sink cannot produce output data. In some implementations a functional unit of the second set (e.g. finite state machine 26) may send data to a functional unit of the first set (e.g. the analog-to-digital converter 24a) in order to trigger a new analog-to-digital conversion. However, the general direction of the data flow is from the analog bus 20 to the functional units 24 of the first set (e.g. analog-to-digital converters comparators, etc.) and further via the event bus to the functional units of the second set (e.g. the state machines 26a, 26b, the interrupt handler of the micro controller, etc.).

Figure 4:
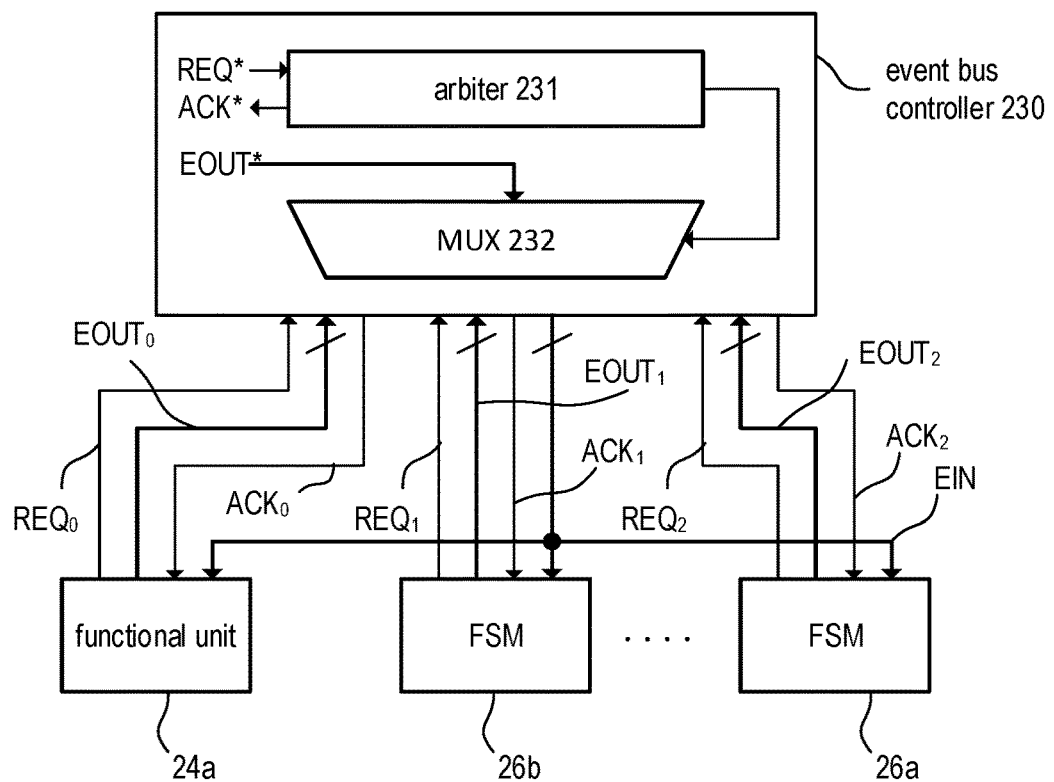
FIG. 4 illustrates an exemplary block diagram of an event bus and connected functional units of the switching converter controller of FIG. 3 according to embodiments herein.

FIG. 4 illustrates one exemplary implementation of the event bus 23. Accordingly, the event bus 23 is includes an event bus controller 230 and lines connecting the event bus controller 230 and the functional units (bus devices) connected via the bus. In the present example, the functional unit 24a (analog-to digital converter) as well as the finite state machines 26a, 26b are connected to the event bus controller 230. The bus lines between the event bus controller 230 and the connected functional units 24a-c, 26a-b, etc. include control lines $REQ_0$, $REQ_1$, $REQ_2$, etc. (request lines), $ACK_0$, $ACK_1$, $ACK_2$, etc. (acknowledge lines), as well as data lines EIN (input data lines) and $EOUT_0$, $EOUT_1$, $EOUT_2$, etc. (output data lines). In FIG. 4, the labels REQ*, ACK* and EOUT* are placeholders for the mentioned request lines, acknowledge lines and output data lines. In the present example, the request and acknowledge lines transmit binary (Boolean) control signals, whereas the input and output data lines transmit bits as previously discussed.

The event bus 23 basically includes an arbiter 231 and a multiplexer 232. Generally, an arbiter is an electronic circuit which allocates access to shared resources which are, in the present example, the input data lines EIN. It is understood that the label EIN denotes a set of parallel lines, as the data words to be transmitted are composed of a plurality of bits (e.g. 16 input data lines for the transmission of 16-bit data words). Similarly, each of the labels $EOUT_0$, $EOUT_1$, $EOUT_2$, etc. denote corresponding sets of output data lines. The request lines $REQ_0$, $REQ_1$, $REQ_2$ are connected to the arbiter 132 which may be an asynchronous arbiter operable to process requests from the connected functional units in a defined order which depends on the implemented arbitration algorithm. Various arbitration algorithms are as such known in the field and thus not discussed here. Generally, the arbiter guarantees that the state of the input data lines EIN represents the state of the output data lines of only one functional unit (e.g. lines $EOUT_2$ of functional unit 24a) and thus prevents collision/interference of two functional units trying to transmit data across the bus at the same time.

When receiving two or more concurrent requests, the arbiter 2 will determine an order in which the requests will be processed. The first request of the determined order (e.g. from functional unit 24a) is then processed by configuring the multiplexer 232 to feed the output data generated by the requesting functional unit (functional unit 24a, in the present example) through to the input data lines EIN, so that all connected functional units can read the output data generated by the requesting functional unit. Subsequently, the arbiter 231 may acknowledge the first request and process the second request of the determined order. Accordingly, the multiplexer 232 is operable to feed the output data generated by the functional unit that generated the second request through to the input data lines EIN, and subsequently, the arbiter 231 may acknowledge the second request and process the next request (if any further request is pending).

As mentioned, numerous arbitrations algorithms exist for arbitrating concurrent requests. For example, a priority value may be assigned to the request lines $REQ_0$, $REQ_1$, $REQ_2$, etc. (and thus to the functional units connected by the event bus). In this case, a request signaled via request line $REQ_i$ may have precedence over a request signaled via request line $REQ_j$ for $i<j$ (assuming that lower indices have higher priority with 0 indicating the highest priority). In another example, a round robin method may be used to determine the order of the requests. Many other arbitration approaches may also be suitable.

It is noted that only those functional units need to be connected to the input data lines EIN which are receiving data via the event bus 23. Dependent on the implementation, some functional units may be operable to only transmit data via the event bus; these functional units need not be connected to the input data lines EIN. Similarly, only those functional units need a connection to the event bus controller 230 via request lines REQ*, acknowledge lines ACK*, and output data lines EOUT* which are transmitting data via the event bus 23. Dependent on the implementation, some functional units may be operable to only receive data via the event bus; these functional units do not need to be connected via request lines REQ*, acknowledge lines ACK*, and output data lines EOUT* (but only via the input data liens EIN). As mentioned, some functional units may be operable to transmit and receive data using the event bus 23.

Figure 5:
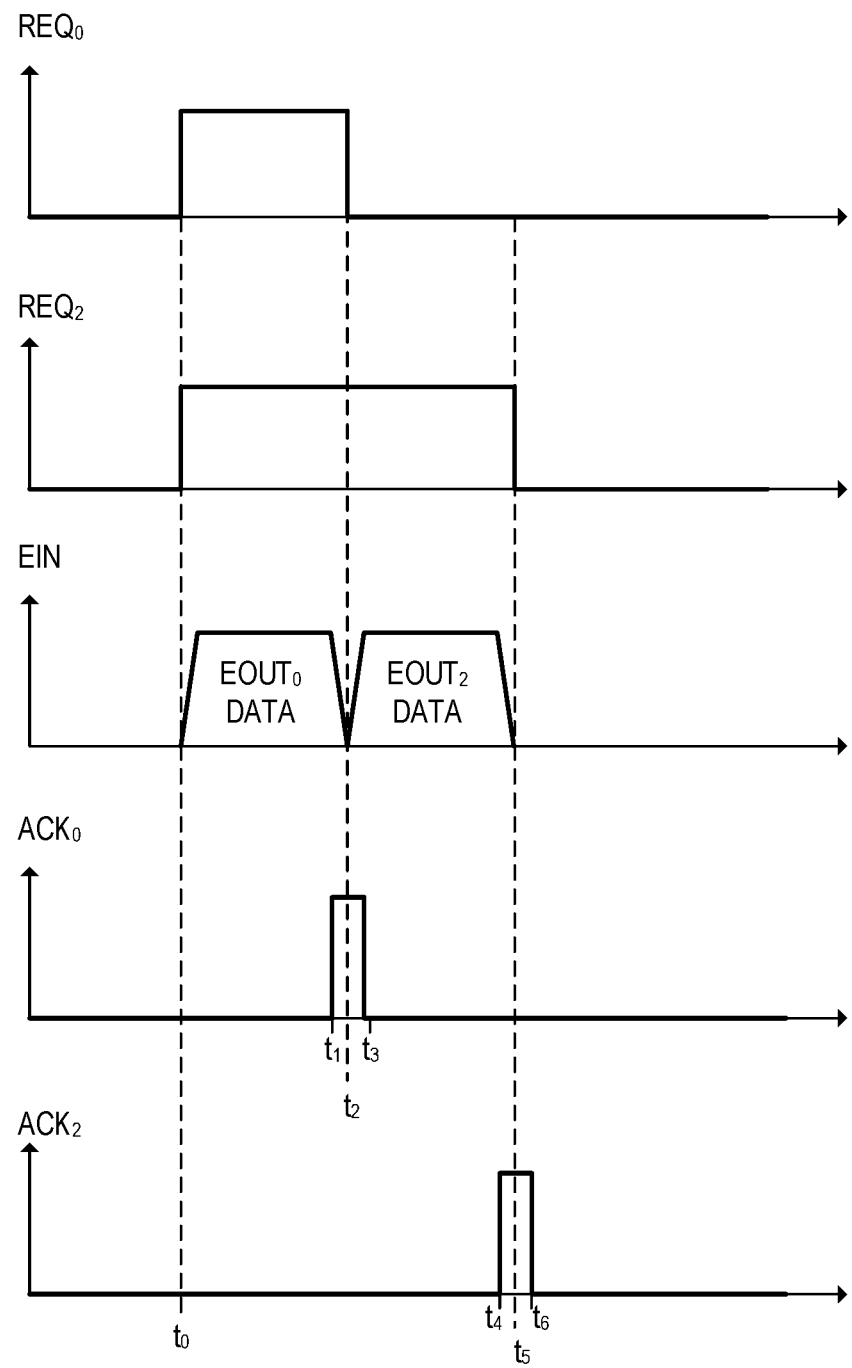
FIG. 5 includes timing diagrams illustrating the function of the event bus of FIG. 4 according to embodiments herein.

FIG. 5 includes timing diagrams of request and acknowledge signals to illustrate the function of an arbiter that uses fixed priorities assigned to the request lines $REQ_0$, $REQ_1$, $REQ_2$, etc. The first and the second timing diagrams of FIG. 5 illustrate request signals received by the arbiter 231 via the request lines $REQ_0$ and $REQ_2$. Referring to the example of FIG. 4, the analog-to-digital converter 24a generates a request on request line $REQ_0$ indicating that an analog-to-digital conversion has been finished and a new sample is ready to be processed by, for example, finite state machine 26b. At the same time, finite state machine 26a generates a request on request line $REQ_2$ indicating that a message is to be transmitted to the micro-controller 25. Both requests arrive at substantially the same time to, at which the logic level of the request signals change from a low level (no request) to a high level (active request). The arbiter gives precedence to the functional unit that uses request line $REQ_0$ as 0 indicates a higher priority than 2. Accordingly, the arbiter 231 forwards the output data provided by analog-to-digital converter 24a at the respective output data lines $EOUT_0$ to the input data lines EIN. The desired recipient of the data may be coded into the data word to be transmitted. For example, the first three bits of the input data may be used to address eight different recipients. In the current example, the finite state machine 26b is addressed by the analog-to-digital converter 24a and will read a new sample. After a defined time span (i.e. at time $t_1$) the arbiter 231 acknowledges the request by setting the acknowledge line $ACK_0$ to a high level. Upon receiving the acknowledge signal, the analog-to-digital converter 24a withdraws, at time $t_2$, its request by resetting the logic level at the request line $REQ_0$ back to a low level (no request). The respective acknowledge signal is reset to a low level a short time later, at time $t_3$.

After the analog-to-digital converter 24a has withdrawn its request at request line $REQ_0$ at time instant $t_2$, the arbiter 231 can process the next request pending at request line and forward the respective output data provided by the finite state machine 26a at the respective output data lines $EOUT_2$ to the input data lines EIN. Again, the desired recipient of the data may be coded into the data word to be transmitted. In the current example, the micro controller is addressed by the finite state machine 26a and will read a data word at from the input data lines EIN. After a defined time span (i.e. at time $t_4$) the arbiter 231 acknowledges the request by setting the acknowledge line $ACK_2$ to a high level. Upon receiving the acknowledge signal, the finite state machine 26a withdraws its request at time $t_5$ by resetting the logic level at the request line $REQ_2$ back to a low level (no request). The respective acknowledge signal is reset to a low level a short time later at time $t_6$. The data is provided to the input data lines EIN as ling the request signal is active at the respective request line (line $REQ_2$ in the present example).

As can be seen from FIG. 3, the functional units coupled to the event bus 23 can be subdivided into two sets. The first set of functional units is labeled with reference numeral 24 and includes the functional units 24a-c which are operable to receive (e.g. analog) data from the analog bus 20 and send data to the event bus 23. The second set of functional units is labeled with reference numeral 26 and includes the functional units 26a-b, which are operable to receive data from the event bus 23. A functional unit of the first set can also be a functional unit of the second set if it is operable to send data to and receive data from the event bus 23. At least one functional unit of the second set (e.g. FSM 26a) is operable to determine switching time instants for the switching converter based on the data received via the event bus.

As can be seen from the example of FIGS. 3-5, an intra IC bus such as the event bus 23 allows an efficient communication between functional units of the controller IC serving as data sources such as analog-to-digital converters, comparators or the like and other functional units serving as data sinks such as the finite state machines, which process the received data in order to control the switching time instants of the electronic switches included in the switching converter. No software is needed in the micro controller to manage the communication across the event bus. As such, the complexity of the software in the microcontroller is reduced and strict real-time requirements may more easily be complied with.

We claim:

1. A control circuit operable to control a switching converter, the control circuit comprising:
    an analog bus operable to receive input signals;
    a first set of functional units operable to receive at least some of the input signals via the analog bus and to process the input signals to generate digital output data based on the received input signals;
    an event bus comprising an event bus controller and multiple bus lines;
    a second set of functional units operable to receive the output data via the event bus from the functional units of the first set, wherein at least one functional unit of the second set of functional units is operable to determine switching time instants for the switching converter based on the output data received via the event bus; and
    wherein the event bus controller includes an arbiter operable to arbitrate data transmission across the multiple bus lines.

2. The control circuit of claim 1, wherein the multiple bus lines of the event bus comprise:
    output data lines, request lines, and acknowledge lines connecting each functional unit of the first set with the event bus controller;
    input data lines connecting the event bus controller with the functional units of the second set.

3. The control circuit of claim 2, wherein each of the functional units of the first set is operable to signal a request to the event bus controller via the respective request line when the output data provided at the output data lines has been updated, and
    wherein the event bus controller is operable to direct, when receiving a request at one of the request lines, the output data received from the respective output data lines to the input data lines and to signal an acknowledge at the respective acknowledge line to the respective functional unit of the first set.

4. The control circuit of claim 3, wherein at least one of the functional units of the first set is also a functional unit of the second set.

5. The control circuit of claim 4, wherein at least one of the functional units of the first set is an analog-to-digital converter, the output data of this functional unit including the digital output of the analog-to-digital converter.

6. The control circuit of claim 4, wherein at least one of the functional units of the first set is a comparator, the output data of this functional unit including the binary output of the comparator.

7. The control circuit of claim 1, wherein at least one of the functional units of the second set is a finite state machine operable to determine switching time instants for the switching converter based on the output data received via the event bus.

8. The control circuit of claim 1, wherein the control circuit is integrated in a single chip package.

9. The control circuit of claim 1, wherein the switching converter includes a high-side switch and a low-side switch operable to produce an output voltage; and
wherein the switching time instants are used to control timing of controlling activation of the high-side switch and the low-side switch.

10. The control circuit of claim 1, wherein the event bus controller is operable to receive a first request signal from a first functional unit, the first functional unit being in the first set; and
wherein the event bus controller is operable to receive a second request signal from a second first functional unit, the second functional unit being in the second set.

11. The control circuit of claim 10, wherein the first request signal and the second request signal are assigned different priorities, the first request signal assigned a higher priority than the second request signal.

12. The control circuit of claim 11, wherein the event bus controller is operable to receive first data from the first functional unit prior to receiving second data from the second functional unit in accordance with the different assigned priorities.

13. The control circuit of claim 12, wherein the event bus controller is operable to send a first acknowledgment signal to the first functional unit indicating receipt of the first data; and
wherein the event bus controller is operable to send a second acknowledgment signal to the second functional unit indicating receipt of the second data.

14. A method for controlling a switching converter, the method comprising:
receiving input signals by an analog bus;
receiving at least some of the input signals, via the analog bus, by a first functional unit of a first set of functional units;
processing the received input signals by the first functional unit to generate digital output data based on the received input signals;
transmitting the output data to an event bus, which comprises an event bus controller and multiple bus lines;
arbitrating data transmission across the multiple bus lines by an arbiter included in the event bus controller;
receiving the output data by a second functional unit of a second set of functional units via the event bus; and
determining, by the second functional unit, switching time instants for the switching converter based on the output data received via the event bus.

15. The method of claim 14, wherein the multiple bus lines of the event bus comprise:
output data lines, request lines, and acknowledge lines connecting each functional unit of the first set with the event bus controller;
input data lines connecting the event bus controller with the functional units of the second set.

16. The method of claim 15, wherein transmitting the output data to the event bus comprises:
signaling a request to the event bus controller by the first functional unit via the respective request line, when the output data provided at the output data lines has been updated, and
directing, when receiving a request at one of the request lines, the output data received from the respective output data lines to the input data lines coupled to the second functional unit; and
signaling an acknowledge at the respective acknowledge line to the first functional unit.

* * * * *